United States Patent [19]

Kalis

[11] Patent Number: 5,334,798
[45] Date of Patent: Aug. 2, 1994

[54] INTERCONNECT CABLE WITH BUILT-IN SHIELDING AND METHOD OF USE

[75] Inventor: Robert M. Kalis, Prairie Village, Kans.

[73] Assignee: Allied-Signal Inc., Morristown, N.J.

[21] Appl. No.: 2,303

[22] Filed: Jan. 8, 1993

[51] Int. Cl.⁵ .............................................. H05K 9/00
[52] U.S. Cl. .................... 174/35 R; 29/747;
439/607; 439/610; 361/785; 361/816
[58] Field of Search ............ 174/32, 35 R, 35 C,
174/35 GC; 361/395, 394, 397, 412, 413, 414,
415, 424, 399; 439/607-610, 109; 267/158-160;
29/729, 739, 747, 749

[56] References Cited

U.S. PATENT DOCUMENTS

| | | | |
|---|---|---|---|
| 3,899,231 | 8/1975 | Bray | 439/80 |
| 4,749,821 | 6/1988 | Linton et al. | 174/35 R |
| 4,823,235 | 4/1989 | Suzuki et al. | 174/35 R X |
| 4,967,311 | 10/1990 | Ferchau et al. | 361/395 |
| 5,029,254 | 7/1991 | Stickney | 174/35 GC |
| 5,039,826 | 8/1991 | Newland | 174/35 R |
| 5,043,528 | 8/1991 | Mohr | 174/35 GC |
| 5,064,388 | 12/1991 | Paladel | 439/607 |
| 5,124,889 | 6/1992 | Humbert et al. | 361/424 |
| 5,125,854 | 6/1992 | Bassler et al. | 439/607 |
| 5,209,677 | 5/1993 | Bricaud | 439/607 |
| 5,213,521 | 5/1993 | Arisaka | 439/608 |
| 5,228,864 | 7/1993 | Fusselman et al. | 439/607 X |
| 5,233,507 | 8/1993 | Günther et al. | 174/35 R X |

Primary Examiner—Lincoln Donovan
Assistant Examiner—Christopher Horgan
Attorney, Agent, or Firm—Allegretti & Witcoff, Ltd.

[57] ABSTRACT

An apparatus and a method of use for electrically connecting two printed circuit boards separated by an electrically grounded enclosure wall. The apparatus comprises a flexible, multi-conductor, flat cable that has exposed edge terminations on either end and an enlarged area comprising ground planes. The cable folds upon itself so that all three ground planes electrically connect so that after the cable passes through an opening in the wall and connects the printed circuit boards, the ground planes mechanically seal the opening and electrically shield the printed circuit boards.

13 Claims, 3 Drawing Sheets

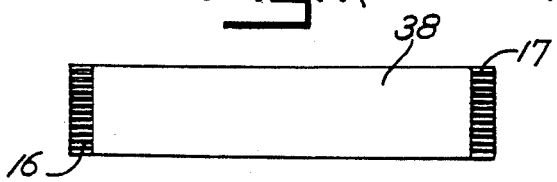
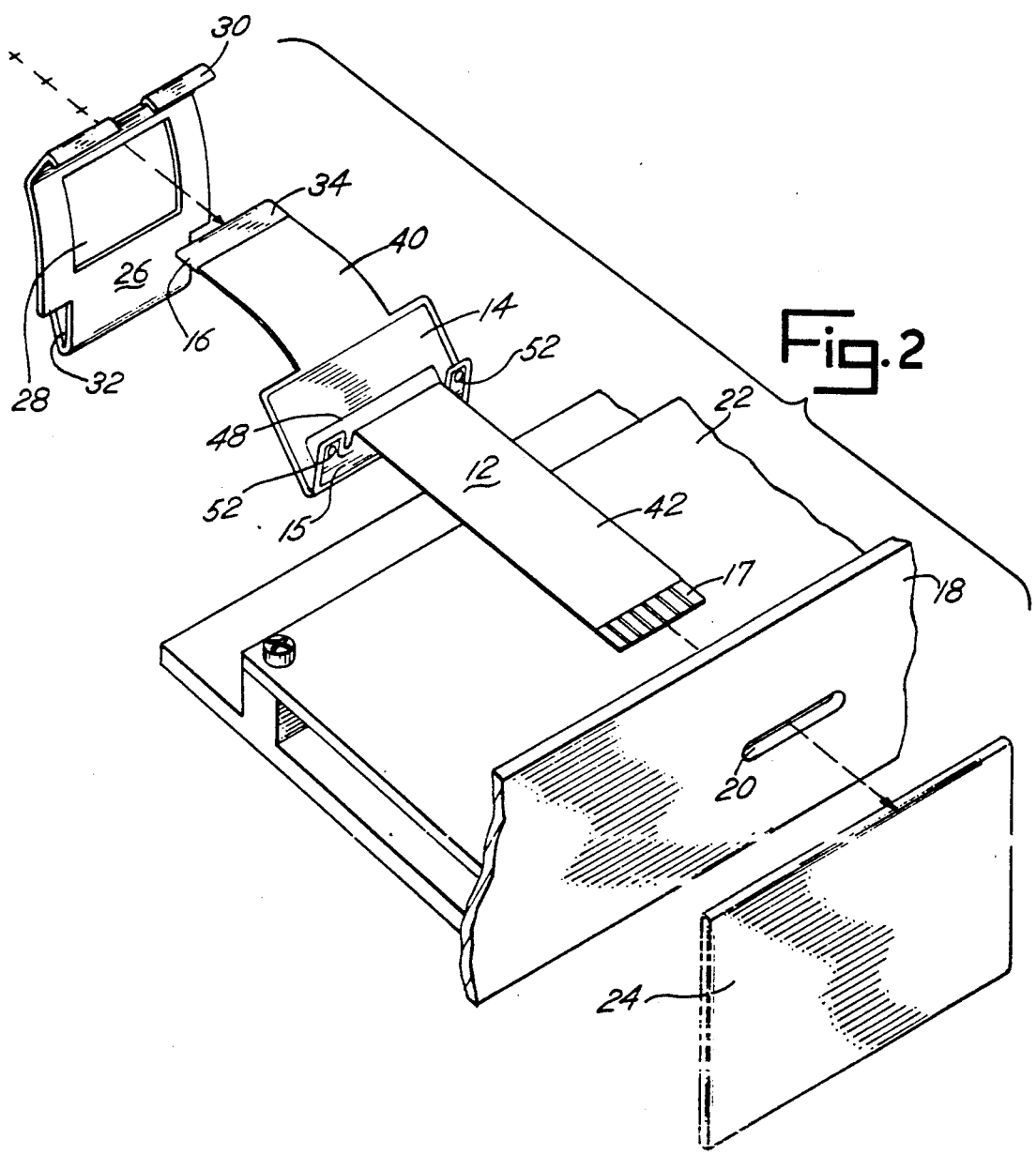

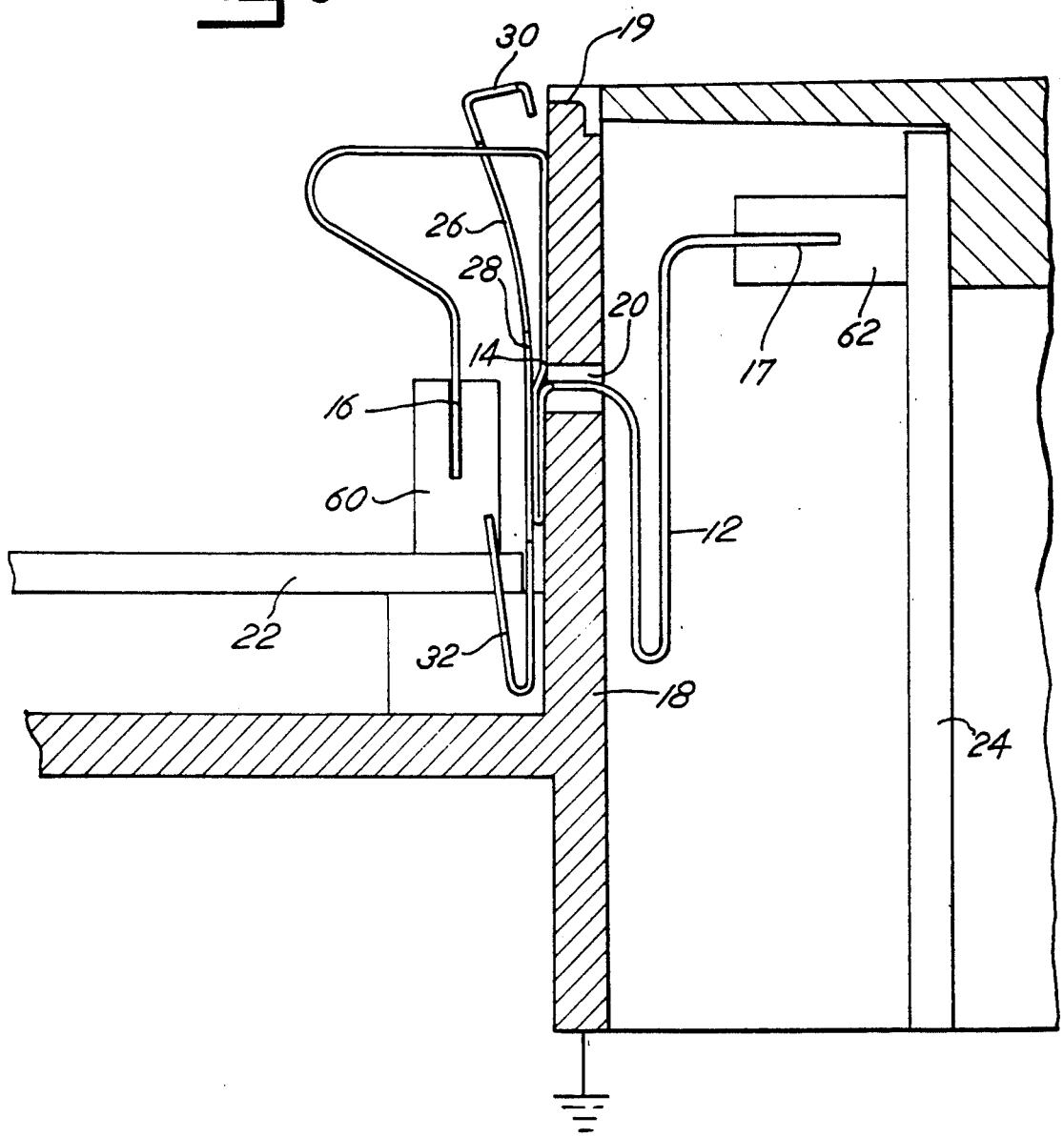

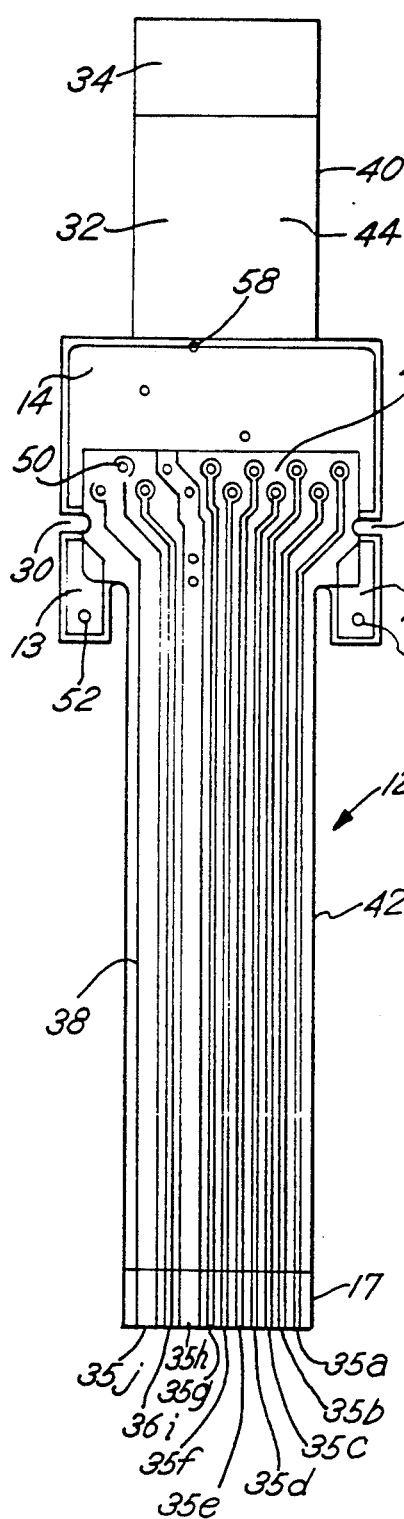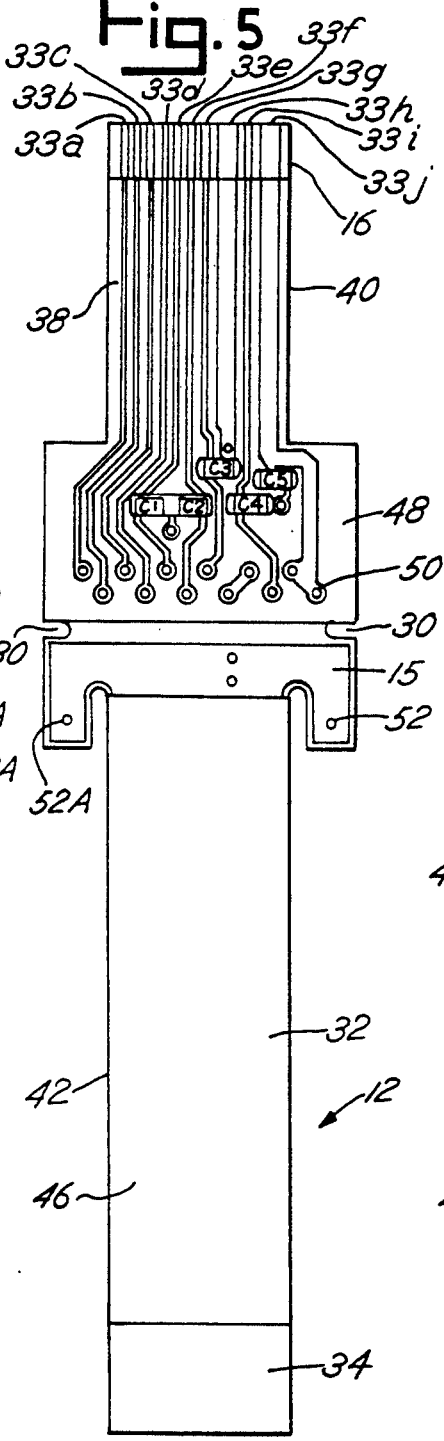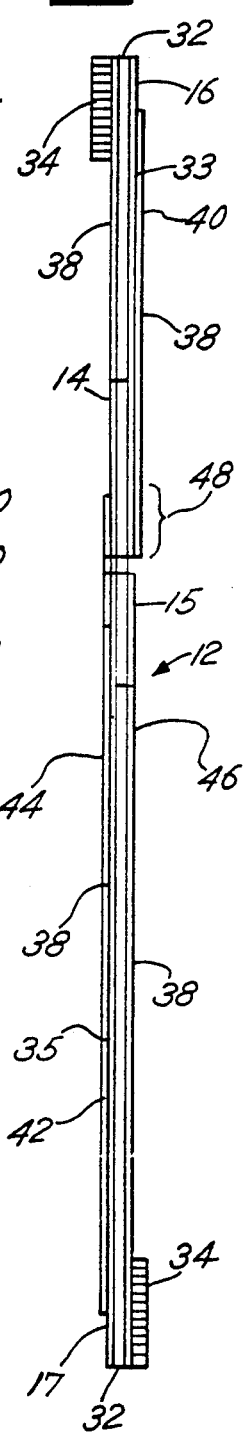

INTERCONNECT CABLE WITH BUILT-IN SHIELDING AND METHOD OF USE

FIELD OF THE INVENTION

This invention relates to electrical cable and, more particularly, to an electrical cable and a method of use for electrically interconnecting printed circuit boards mounted in separate enclosures, and at the same time providing isolation between the circuit boards from electromagnetic interference and radio frequency interference.

BACKGROUND OF THE INVENTION

Many electronic equipment assemblies require electrical shielding between separate printed circuit boards. Electromagnetic waves (electromagnetic interference or "EMI") or radio frequencies (radio frequency interference or "RFI"), or, commonly known as electrical "noise," generated by one circuit board may adversely affect the operation of a second circuit board. However, a problem arises when two circuit boards that must be electrically shielded from each other must also electrically interface.

Numerous applications exist that require a means to electrically shield printed circuit boards, but at the same time provide a means for an electrical interface between the circuit boards. One particular application is a two-way radio used in police, fire and other emergency vehicles. The radio housing is divided into separate enclosures which mechanically isolate the individual circuit boards as a means to prevent electrical noise from one circuit board interfering with the operation of another circuit board. For example, the heat and/or noise generated by a power or transmitter circuit may interfere with the function of a receiver or logic circuit board.

However, the enclosures may not provide complete shielding between the circuit boards. This is because openings exist in the enclosure walls to allow multi-conductor cables to pass through to electrically interconnect the circuit boards. The openings provide a means for heat and noise to propagate from one enclosure to another and eliminate any isolation benefit of an enclosure.

A common way of interconnecting two isolated circuit boards without introducing EMI or RFI is to use feed-through capacitors. A feed-through capacitor mounts into an opening of the enclosure wall separating the circuit boards and is secured by soldering or mechanical means. A conductor passes through the center of the capacitor and the electrical signal is filtered by the capacitor. The noise currents are shunted to the enclosure through the dielectric material of the feed-through capacitor. This method may be convenient if only one or two conductors connect the circuit boards; however, if multiple conductors are required, this method is expensive, bulky, because multiple feed-through capacitors take up too much space, labor intensive and restrict the ease of assembling the electronic product.

Another method of connecting two isolated circuit boards is to use a multiple-conductor ribbon cable. The ribbon cable is easy to install and inexpensive. However, conventional ribbon cables do not have the capabilities of electrically shielding the conductors to filter out electrical noise. One of the disadvantages of using ribbon cable is that the installation process would require an extra step to shield the opening between the circuit boards in which the ribbon cable passes. The shielding procedure adds greater inefficiencies to the assembly of the electronic product that would outweigh the benefits offered by the ribbon cable.

Therefore, a means is needed to provide complete mechanical isolation and electrical shielding when interconnecting circuit boards in separate enclosures.

SUMMARY OF THE INVENTION

The invention comprises a multi-conductor, flat interconnect cable with a means of providing mechanical isolation and electrical shielding between circuit boards separated by a grounded enclosure wall having an opening for the cable to pass through. The interconnect present invention comprises an interconnect cable for electrically connecting a first circuit board with a second circuit board separated by an enclosure wall having an opening comprising: a first means of electrically connecting the cable to the first circuit board; a second means of electrically connecting the cable to the second circuit board; means for conducting current and voltage signals from the first circuit board to the second circuit board; and a means for providing electrically shielding. The electrical shielding means is positioned at the location on the cable such that when the cable connects two separate circuit boards through the opening in the enclosure wall, the electrical shielding means mechanically seals the opening and electrically shields the circuit boards. The apparatus further comprises a means of securely contacting the electrical shielding means with the enclosure wall so that the electrical shielding means effectively contacts with electrical ground.

The method of electrically connecting a first and second printed circuit board separated by a grounded enclosure wall having an opening using the invention comprises: attaching the first electrical connection means to the first printed circuit board; passing the second electrical connection means through the enclosure opening; attaching the second electrical connection means to the second printed circuit board; and securely positioning the electrical shielding means over the opening, whereby the electrical shielding means effectively overlaps the opening and mechanically seals the opening and electrically shields the first and second circuit boards.

In the preferred embodiment, the invention comprises a multi-conductor cable that may be considered to be a hybrid between a ribbon cable or a flat laminated cable and a flex circuit. A flex circuit is similar to a printed circuit board in that copper conductors are etched onto a non-conducting substrate as known in the art. The conductors electrically connect electronic components, such as electronic chips, diodes, resistors, transistors and capacitors, that makeup the electronic circuits on a flex circuit or a printed circuit board. However, a flex circuit differs from a printed circuit board in that the flex circuit is flexible in the same manner as a ribbon cable. Flex circuits are used in the place of rigid circuit boards when there is limited space in which to mount a printed circuit board. The nature of the flex circuit allows it to fold upon itself and thus reduce its space requirements.

The multi-conductor cable of the invention has exposed edge terminations on either end that connects to an electrical connector located on the separate circuit boards. The cable can be plugged into or unplugged out of the connectors repeatedly, making it convenient for electrically connecting sub-assemblies (circuit boards) by means of current and or voltage signals, similar in function to a ribbon cable. In addition, the multi-conductor cable of the invention has the capability of having conductors etched onto its surface in a way that allows for the mounting of electronic devices on the cable, similar in function to a flex circuit.

The apparatus of the preferred embodiment of the invention comprises an interconnect cable and a spring clip. The interconnect cable comprises a first connection end, a second connection end, a first conductor path, a second conductor path, a connection plane, a first ground plane, a second ground plane and a third ground plane. The first and second ground planes are located on one side of the interconnect cable and the third ground plane is located on the opposite side. All three ground planes are positioned on the interconnect cable such that when the cable folds back upon itself and connects two circuit boards through an opening in an enclosure wall, the ground planes mechanically seal and electrically shield the opening. The spring clip provides constant uniform pressure to assure a positive contact between the ground planes and the enclosure wall.

The method of electrically connecting a first and second circuit board separated by an enclosure wall using the preferred embodiment of the invention comprises: electrically connecting the first connection end to the first printed circuit board; folding the interconnect cable back onto itself so the first and second ground planes contact each other; threading the second connection end through the opening; electrically connecting the second connection end to the second circuit board; and detachably fastening the spring clip to the enclosure wherein the first and third ground planes are compressively contacted with the enclosure wall, whereby the first and third ground planes provide an electrical path to ground and mechanically seal the opening.

If capacitive filtering is required for individual conductors, chip capacitors can be mounted directly to the interconnect cable.

The object of the invention is to provide a multi-conductor cable to connect circuit boards, separated by an enclosure wall, without introducing an opening between the circuit boards where EMI or RFI leakage may occur.

An advantage of the invention is that it is easy to electrically connect and disconnect two circuit boards separated by an enclosure wall.

A further advantage of the invention is that it is flexible and maneuverable for electrically connecting two circuit boards when the circuit boards are not adjacent to each other or are separated by an enclosure wall.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which:

FIG. 1 illustrates a flat laminated cable of the prior art;

FIG. 2 is an assembly diagram of the invention connecting two circuit boards separated by a enclosure wall;

FIG. 3 is a cross-sectional elevation view of the invention in its intended use;

FIG. 4 is a view of one side of the interconnect cable of the invention;

FIG. 5 is a view of the alternate side of the interconnect cable shown in FIG. 4; and FIG. 6 is an exaggerated side elevation view of the interconnect cable shown in FIGS. 3 and 4.

DETAILED DESCRIPTION OF THE INVENTION

FIG. 1 illustrates an example of an connection cable in the prior art. This cable is used to electrically connect circuit boards when the circuit boards are not separated by an enclosure wall or when no electrical shielding or filtering is required. The cable consists of electrical conductors sandwiched between non-conducting substrates 38 with exposed connection ends 16 and 17.

FIG. 2 illustrates the elements that comprise the invention. An interconnect cable 12 is a generally rectangular, coplanar, multi-conductor, flexible cable that electrically connects a first printed circuit board 22 to a second printed circuit board 24. Interconnect cable 12 comprises a first connection end 16, a second connection end 17, a first conductor path 40, a second conductor path 42 and an enlarged surface area consisting of a first ground plane 14, a second ground plane 13 and 13A (not shown), a third ground plane 15 and a connection plane 48.

The construction of the interconnect cable 12 is similar to the construction of a flex circuit. FIG. 6 is an exaggerated side view of interconnect cable 12 illustrating its multiple layers of material. Base film 32 is the foundation of the entire length of cable 12. Base film 32 is generally made from Kapton, manufactured by DuPont. Generally, base film 32 is between 1 to 5 mils (thousandth of an inch, 0.001) thick and preferably about 1 mil thick. It comprises a front face 44 and a rear face 46.

As shown in FIG. 5, a first set of copper conductors 33(a-j) are clad on the rear face 46 of base film 32 in the area occupied by the first copper conductor path 40. One end of each of the copper conductors 33(a-j) terminates at connection end 16 on rear face 46, and the opposite end terminates at connection plane 48 as a via hole 50. As shown in FIG. 4, one end of each of the copper conductors 35(a-j) terminates at connection end 17 on front face 44, and the opposite end terminates at connection plane 48 as via holes 50. It should be understood that each copper conductor 33(a-j) corresponds with a copper conductor 35 (a-j) and is properly aligned so that each corresponding conductor terminates at a corresponding via hole 50. Via holes 50 are plated through so that the corresponding conductors are electrically connected, meaning there is electrical continuity between corresponding conductors, thus eliminating open circuits. Via holes 50 also allow the mounting of electronic chips (not shown) between conductors.

An alternate embodiment provides for the conductors to terminate in multiple via holes 50 to allow for the mounting of more than one electronic chip between conductors. A further alternate embodiment provides for via holes 50 at any point along each copper conductor. It is understood that the location and number of via holes 50 are dependent upon the electrical circuit specifically designed for.

Referring to FIGS. 4 and 6, on front face 44, a cover film 38 covers base film 32 in the area of the first conductor path 40. Cover film 38 covers the base film 32 and copper conductors 35(a–j) in the area of the second conductor path 42 and connection plane 48. The only area not covered by cover film 38 is the copper clad area of ground planes 13, 13A and 14 and connection end 17.

Referring to FIGS. 5 and 6, on rear face 46, cover film 38 covers base film 32 and copper conductors 33(a–j) in the area of the first conductor path 40 and the connection plane 48. Cover film 38 covers base film 32 in the area of the second conductor path 42. The only area not covered by cover film 38 is the copper clad area of ground plane 15 and connection end 16.

Opposite the side of each connection end 16 and 17 is a supporting tape 34. Supporting tape 34 is preferred because it provides additional structural support to the connection ends as they are inserted into the connection blocks 60 and 62 on the printed circuit boards 22 and 24 respectively as shown in FIG. 3.

The sizes of ground planes 13, 14 and 15 are dependent upon the width of interconnect cable 12, which in turn is dependent upon the number of conductors connecting the circuit boards. The width of interconnect cable 12 also determines the width of opening 20. Wall opening 20 must be sufficiently larger in width than interconnect cable 12 to prevent any damage to cable 12 during the installation process. Ground plane 14 is dimensioned so that it is larger in surface area than opening 20, and when installed, sufficiently overlaps opening 20.

As shown in FIG. 3, printed wiring boards 22 and 24 are separated by a grounded enclosure wall 18. Enclosure wall 18 is an integral portion of the overall electronic housing, in this application, a radio housing. The housing is grounded to the chassis of the vehicle in which the radio is mounted. Therefore, when installed, as described below, ground plane 14 will effectively mechanically seal opening 20 and contact the enclosure wall 18 surrounding opening 20 to provide a solid path to electrical ground.

As shown in FIGS. 2 and 3, interconnect cable 12 folds back on itself at notches 30 so that ground plane 13 and 13A overlaps and electrically contacts ground plane 14. Ground planes 13, 13A and 15 maintain electrical continuity by via holes 52 which are plated through. Therefore, when interconnect cable 12 is installed, ground planes 13, 14 and 15 maintain electrical contact with each other and provide a path to ground. The use of ground planes 13, 13A and 15 are preferred, because it can be seen that ground plane 15 provides additional surface area to contact enclosure wall 18. However, an alternate embodiment of interconnect cable 12 consists of only ground plane 14 as a means of mechanically sealing opening 20 and electrically shielding the circuit boards.

FIGS. 2 and 3 also illustrate the corresponding spring clip 26 that compressively contacts ground planes 14 and 15 against enclosure wall 18. Generally, spring clip 26 is a flexible material, preferably carbon steel, so that, when installed, it compresses the ground planes against enclosure wall 18. Alternatively, spring clip 26 may be constructed of other materials, such as plastic, so long as when it is installed, it provides compressive forces against enclosure wall 18.

Spring clip 26 comprises a first attachment end 30 and a second attachment end 32. In this embodiment, circuit board 22 is mounted horizontally and circuit board 24 is mounted vertically. It should be understood that circuit boards 22 and 24 may be oriented in various positions, which implies that the circuit boards may be mounted using various methods. Accordingly, attachment ends 30 and 32 may be any means to securely attach spring clip 26 against enclosure wall 18; whereas, FIGS. 2 and 3 illustrate only two of many possible means of doing so. In the embodiment shown in FIGS. 2 and 3, attachment end 30 consists of a squared channel that, when installed, hooks over lip 19 of enclosure wall 18. Attachment end 32 consists of a "V" shaped trough, that when installed, is tensioned between the enclosure wall 18 and the edge of circuit board 22.

Spring clip 26 also comprises an opening 28 that allows the spring clip 26 to slip over the first conductor path 40 and abut the edge of ground plane 14. Opening 28 is dimensioned so that its width is larger than the width of first conductor path 40, but smaller than the width of ground plane 14.

Interconnect cable 12 connects circuit boards 22 and 24 by passing through opening 20 contained in wall 18. The method of electrically connecting a first and second printed circuit boards separated by a enclosure wall using a interconnect cable comprises: threading opening 28 over the first conductor path 40; electrically connecting the first connection end 16 to the first printed circuit board 22; folding the interconnect cable 12 back onto itself at the two folding notches 30 so that ground plane 13 contacts ground plane 14; threading the second connection end 17 and second conductor path 42 through opening 20; electrically connecting the second connection end 17 to the second printed circuit board 24; and detachably fastening the spring clip to the enclosure wall wherein ground planes 14 and 15 are compressively positioned between the spring clip and the enclosure wall 18 whereby the ground planes provide an electrical path to ground and effectively seal the enclosure wall opening.

Optionally, interconnect cable 12 can consist of a means to ground each circuit board. As shown in FIGS. 4 and 5, conductors 33h and 35h connect to ground plane 14. Conductor 33h connects to ground plane 14 by way of via hole 58. In this manner, when ground plane 14 contacts wall 18, circuit boards 22 and 24 connect with ground by way of conductors 33h and 35h respectively.

If capacitive filtering is required on individual conductors, chip capacitors can be mounted directly to the interconnect cable.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. An interconnect cable that electrically connects a first circuit board with a second circuit board, said first and second circuit boards being separated by an enclosure wall having an opening through which said cable passes, said cable comprising:
    (a) a first connecting means for electrically connecting said cable to said first circuit board;
    (b) a second connect means for electrically connecting said cable to said second circuit board;
    (c) conducting means for conducting current and voltage signals between said first circuit board and said second circuit board; and (d) shielding means for providing electrical and mechanical shielding;

whereby, when said cable connects said first and second circuit boards by passing through said opening, said shielding means mechanically seals said opening and electrically shields said circuit boards.

2. The interconnect cable of claim 1 wherein said conducting means comprise:
   (a) a first conductor path comprising at least one conductor;
   (b) a second conductor path comprising a number of conductors corresponding to said conductors of said first conductor path; and
   (c) a connection plane;
   wherein said first conductor path is located on a side of said cable oppositely disposed of said second conductor path and said conductors of said first conductor path electrically contact said corresponding conductors of said second conductor path at said connection plane.

3. The interconnect cable of claim 2 wherein said conductors of said first conductor path electrically contact said corresponding conductors of said second conductor path by via holes.

4. The interconnect cable of claim 1 further comprising electronic devices electrically connected to said conducting means to provide signal filtering.

5. The interconnect cable of claim 1 wherein said shielding means is a ground plate.

6. An apparatus for electrically connecting a first circuit board with a second circuit board via a grounded enclosure wall having an opening, said apparatus comprising:
   an interconnect cable comprising:
   (a) a first connection end and a second connection end;
   (b) at least one electrical conductor having a first end and a second end attached onto said cable, said first end terminating at said first connection end and said second end terminating at said second connection end; and
   (c) a first electrical shield substantially coextensive with said cable and of sufficient area to cover said opening and contact said enclosure wall.

7. The apparatus of claim 6 further comprising a contacting means for securely contacting said electrical shield with said enclosure wall so that said electrical shield effectively contacts with electrical ground.

8. The apparatus of claim 7 wherein said contacting means is a spring clip.

9. The apparatus of claim 6 further comprising electronic devices electrically connected to said electrical conductors to provide signal filtering.

10. The apparatus of claim 6 further comprising a second electrical shield and a third electrical shield wherein said first and second electrical shields are located on a side of said cable oppositely disposed of said third electrical shield and said second electrical shield electrically connects with said third electrical shield.

11. The apparatus of claim 10 wherein said second electrical shield electrically connects with said third electrical shield by via holes.

12. The apparatus of claim 6 wherein said electrical shield electrically connects with at least one of said electrical conductors.

13. A method of electrically connecting a first circuit board with a second circuit board separated by a grounded enclosure wall having an opening using an interconnect cable comprising a first connection end and a second connection end, at least one electrical conductor having a first end and a second end attached onto said cable, said first end terminating at said first connection end and said second end terminating at said second connection end, and a first electrical shield substantially coextensive with said cable and of sufficient area to cover said opening and contact said enclosure wall comprising the steps of:
   (a) electrically connecting said first connection end to said first printed circuit board;
   (b) folding said interconnect cable back onto itself and threading said second connection end through said opening wherein said electrical shield effectively overlaps said opening;
   (c) electrically connecting said second connection end to said second printed circuit board; and
   (d) compressively contacting said electrical shield with said enclosure wall.

* * * * *